United States Patent
Allison et al.

(10) Patent No.: US 6,882,247 B2
(45) Date of Patent: Apr. 19, 2005

(54) RF FILTERED DC INTERCONNECT

(75) Inventors: Robert C. Allison, Rancho Palos Verdes, CA (US); Jerold K. Rowland, Torrance, CA (US); Thomas M. Sharpe, Fountain Valley, CA (US)

(73) Assignee: Raytheon Company, Waltham, MA (US)

( * ) Notice: Subject to any disclaimer, the term of this patent is extended or adjusted under 35 U.S.C. 154(b) by 368 days.

(21) Appl. No.: 10/146,186

(22) Filed: May 15, 2002

(65) Prior Publication Data

US 2003/0214370 A1 Nov. 20, 2003

(51) Int. Cl.⁷ .............................. H03H 7/01
(52) U.S. Cl. ............... 333/182; 333/183; 333/260
(58) Field of Search ............ 333/12, 181–185, 333/260

(56) References Cited

U.S. PATENT DOCUMENTS

| | | | |
|---|---|---|---|
| 4,801,904 A | * | 1/1989 | Sakamoto et al. ........... 333/182 |
| 4,952,896 A | * | 8/1990 | Dawson, Jr. ................. 333/182 |
| 5,032,809 A | * | 7/1991 | Chambers et al. .......... 333/183 |
| 5,153,540 A | * | 10/1992 | Gliha, Jr. ..................... 333/182 |
| 5,552,752 A | | 9/1996 | Sturdivant |
| 5,570,068 A | | 10/1996 | Quan |
| 5,633,615 A | | 5/1997 | Quan |
| 5,668,509 A | | 9/1997 | Hoffmeister |
| 5,675,302 A | | 10/1997 | Howard |
| 5,689,216 A | | 11/1997 | Sturdivant |
| 5,703,599 A | | 12/1997 | Quan et al. |
| 6,094,115 A | | 7/2000 | Nguyen |
| 6,236,287 B1 | | 5/2001 | Quan |
| 6,362,703 B1 | | 3/2002 | Keesey |

OTHER PUBLICATIONS

Data Sheet for Solder–In Filtelrs, 3 pages, Spectrum Control, Inc.

"Standard stacking Connector 102 Signal Paths, " CINCH, 1991.

"Gilbert GPO", Product Information, Gilbert Engineering Co., Inc, Oct. 1992.

* cited by examiner

*Primary Examiner*—Dean Takaoka
(74) *Attorney, Agent, or Firm*—Leonard A. Alkov; Karl A. Vick

(57) ABSTRACT

A filtered button DC interconnect employing a compressible conductor such as a finely wound wire mesh imbedded within a series of dielectric and ferrite cylinders. The compressible conductor is captivated within the series of dielectric and ferrite cylinders to ensure proper contact with mating surfaces of interconnected circuits. The interconnect serves as an RF filter by providing rejection of RF and microwave frequencies between the interconnected circuits.

17 Claims, 2 Drawing Sheets

RF FILTERED DC INTERCONNECT

BACKGROUND OF THE DISCLOSURE

DC interconnects are employed in RF systems to pass power and low speed control signals between separate circuit boards. A challenge is to perform these functions in an RF environment to ensure clean performance, i.e., passing only the DC or control signals and attenuating all unwanted and/or interfering RF signals and digital switching signals that have some RF component to them.

Existing filtered interconnect schemes involve rigid pins and/or flanged connectors that are rigidly attached to a capacitive cylinder. These interconnects must be mechanically hard mounted to the housing floor using solder or epoxy to provide sufficient mechanical integrity and ensure good filter performance, and do not tolerate a large tolerance variation in and/or require an additional wire bond.

SUMMARY OF THE DISCLOSURE

A DC interconnect structure provides a DC interconnection between a first circuit board and a second circuit board. The interconnect structure comprises a first and second dielectric cylindrical structures each having a through opening and a conductive outer layer. A ferrite ring structure is sandwiched between the first and second dielectric structures. A compressible conductor structure is passed through the first and second cylindrical structures and the ferrite ring structure.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE DISCLOSURE

Figure 1:
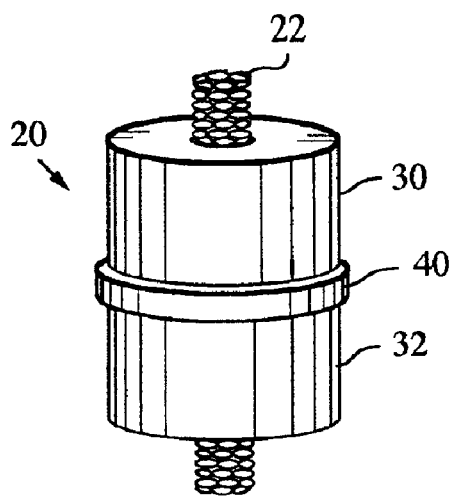
FIG. 1 is an isometric view of the structure 20.
Figure 2:
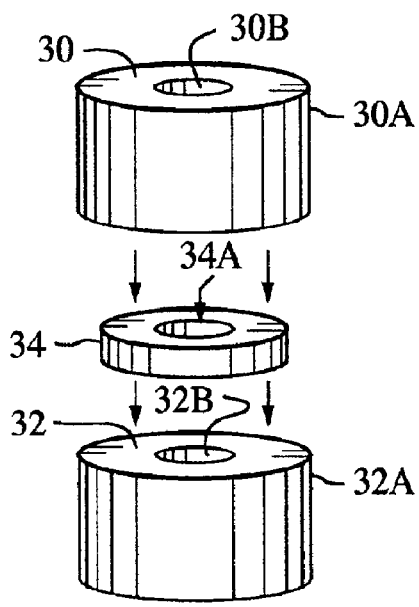
FIGS. 2–4 are respective isometric partial exploded views, illustrating assembly of the structure of FIG. 1.
Figure 3:
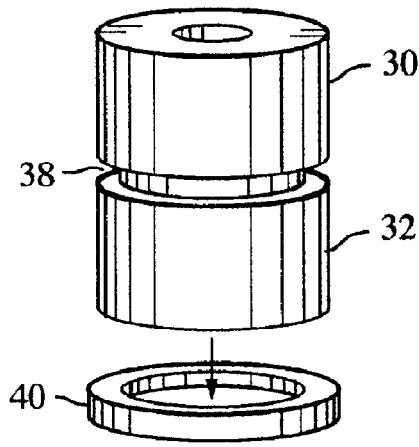
Figure 4:
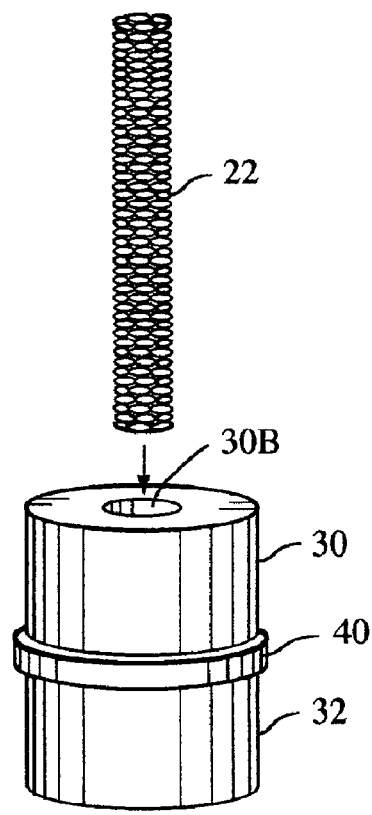
Figure 5:
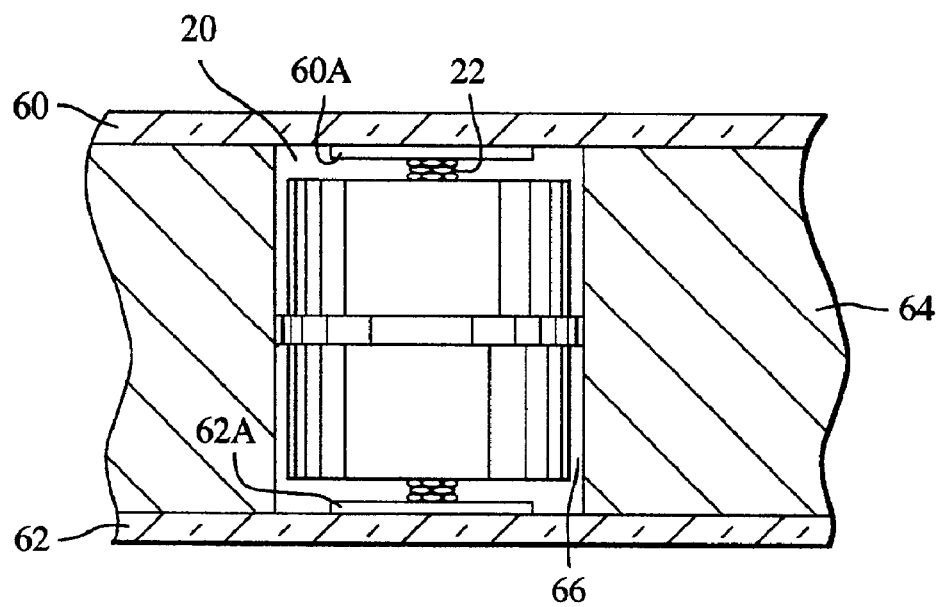
FIG. 5 is a diagrammatic side cutaway view of the interconnect structure of FIG. 1, installed in an exemplary circuit assembly including a top circuit board or substrate, and a bottom circuit board or substrate, and a chassis having a opening formed therein.

An embodiment of a filtered "button" DC interconnect between circuit boards employs a finely wound wire mesh imbedded within a series of dielectric and ferrite cylinders. An exemplary embodiment of a filtered button DC interconnect structure 20 is illustrated in FIGS. 1–4. The structure employs a finely wound wire mesh structure 22 imbedded within a series of dielectric and ferrite cylinders. FIG. 1 is an isometric view of the structure 20. FIGS. 2–4 are respective isometric partial exploded views, illustrating assembly of the structure and its constituent parts. The wire mesh interconnect 20 is captivated within the button structure to prevent movement and ensure proper contact with the mating surfaces. In addition, the interconnect serves as an RF filter by providing rejection of RF and microwave frequencies between the interconnected circuits 60, 62 (FIG. 5). The interconnect structure 20 accommodates wide assembly tolerances while maintaining excellent electrical contact. The compressible wire mesh structure is easily installed and removed.

In the exemplary embodiment 20, two high K dielectric cylinders 30, 32 form shunt capacitors between the wire mesh and outside conductive surfaces 30A, 32A of the cylinders. It is desired to achieve high capacitance, for optimum low pass filtering. Capacitance of a particular structure is proportional to the dielectric constant of the dielectric material of the structure. "High K" refers to a high value of dielectric permeability, i.e., a unitless measure of relative dielectric constant. In general, materials that have K values over 10 are considered high dielectric. A preferred embodiment employs a material with a K exceeding 100. One exemplary dielectric is barium titanate. The cylinders 30, 32 each have a respective through hole 30B, 32B formed through the cylinder axis.

A ferrite bead structure 34 is sandwiched between the cylinders 30, 32, providing a series impedance such that a Pi low-pass filter is formed. The bead structure 34 is a ring-like annular structure having a center hole 34A. The structure is fabricated from a ferrite material, i.e., a ceramic material that has been impregnated with iron oxides. The iron provides a magnetic property used to achieve a high inductance.

FIG. 2 is an exploded view showing the arrangement of the cylinders 30, 32 and the ferrite bead 34. The diameter of the center hole in the ferrite bead is smaller than the diameter of the dielectric holes 30B, 32B to captivate the wire mesh 22 and prevent it from moving with the button assembly. In this exemplary embodiment, the diameter of the ferrite bead center hole is not as large as the diameter of the wire mesh 22. The bead captivates the mesh to prevent it from falling out or becoming asymmetrical, assuring contact on both ends of the mesh.

FIG. 3 shows the cylinders 30, 32 assembled with the ferrite bead 34. The outside diameter of the ferrite bead is smaller than the outer diameter of the dielectric cylinders 30, 32. This forms a groove 38 around the center of the structure 20. An elastic conductive o-ring 40 fits into this groove around the periphery of the ferrite bead 38, and provides a conductive path to ground through the housing. The o-ring can be fabricated in various ways. In one form, the o-ring is fabricated of a metal-filled elastomer. In another embodiment, the o-ring is fabricated of TEFLON loaded with carbon. In yet another exemplary embodiment, the o-ring is a coil spring with windings to allow diametrical flexing. The flexibility of the o-ring allows the o-ring to be installed over the larger diameter of the cylinder 30 or 32 to position the o-ring into the groove 38.

The entire outside of the interconnect structure 20 is plated to provide a good electrical ground plane around the periphery of the button. There are many suitable techniques to form a conductive coating on the interconnect cylinders. For example, a typical plating scheme is an electrolytic or electroless nickel plate followed by an electroplated gold flash. Other techniques could alternatively be employed.

In this exemplary embodiment, the wire mesh 22 is a fine winding of plated metal formed into a spring. The center conductor in an exemplary embodiment is a thin, gold plated, metal wire (usually tungsten or beryllium copper), which is wound up into a knitted, wire mesh cylinder. As illustrated in FIG. 4, the wire mesh 22 is inserted inside the center holes of the cylinders 30, 32 and the bead 34. The ends 22A, 22B of the wire mesh extend well beyond the top and bottom edges of the dielectric cylinders, as shown in FIG. 1. In this exemplary embodiment, the wire mesh has an outer diameter of about 0.040 inches. The wire constituting the mesh is about 0.001 inches in diameter. The ends of the mesh 22 protrude about 0.020 inches from the cylinders, enough to ensure positive connection to the circuit boards when the mesh is compressed in an installation. Other types of compressible conductor could alternatively be employed, e.g., a pogo pin structure.

In use, the mesh 22 compresses to make good electrical contact to corresponding pads on the adjoining circuits. FIG. 5 is a diagrammatic side cutaway view of the interconnect structure 20 installed in a circuit assembly including a top circuit board or substrate 60, and a bottom circuit board or substrate 62, and a chassis 64 having a opening 66 formed therein. Typically, the boards 60 and 62 are placed in isolated cavities, in an effort to prevent interfering signals from leaking between the boards. The chassis in this embodiment is a metal chassis, e.g. fabricated of aluminum. The interconnect structure 20 is fitted into the opening 66, which is sized so that the conductive o-ring makes physical and electrical contact with a conductive plating on the opening 66. The mesh 22 is fitted between the boards 60, 62, so that the mesh is compressed, making good electrical contact with conductive pads on the facing surfaces of the circuit boards. The interconnect structure thus provides DC contact between the circuit boards 60, 62, while preventing interfering signals from being conducted between the circuit boards.

The mesh 22 accommodates large mechanical tolerances while maintaining electrical contact. The button is easily inserted in to the chassis hole 66 and is held in place by the conductive O-ring. No epoxy or solder operations are used to firmly secure the button in place in this exemplary embodiment.

The interconnect structure 20 ensures clean DC performance within an RF environment. The interconnect provides a "blind" connection, maximizing packaging density by not requiring additional wire bonds or access to the connection. Parts can be mounted over the top on the button interconnects further maximizing packaging density.

Figure 6:
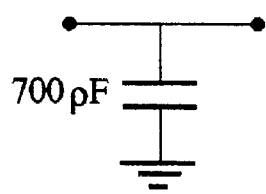
FIG. 6 is an equivalent circuit of a mesh interconnect circuit as in FIGS. 1–4, but without the ferrite bead.
Figure 7:
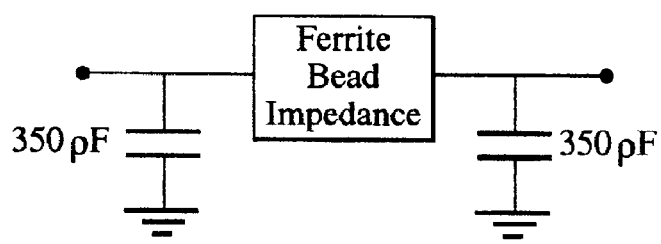
FIG. 7 is an equivalent circuit of the structure, including the ferrite bead.

FIG. 6 is a simplified equivalent circuit of a mesh interconnect circuit as in FIGS. 1–4, but without the ferrite bead. FIG. 7 is an equivalent circuit of the structure 20, including the ferrite bead, which adds inductance to the circuit impedance.

Figure 8:
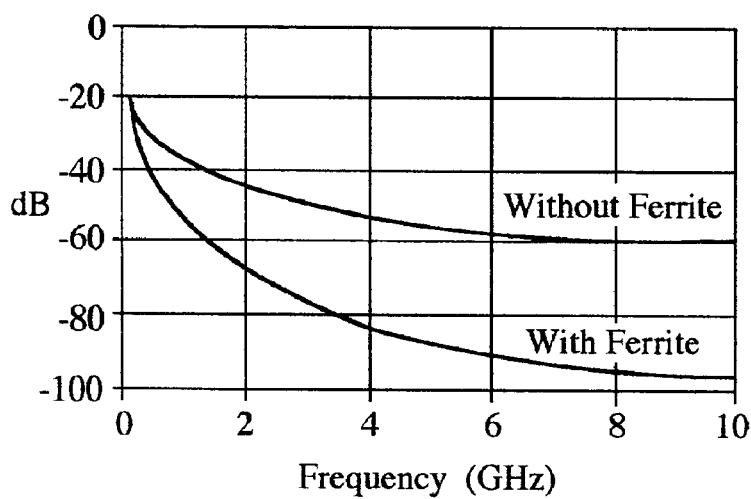
FIG. 8 is a graph of an exemplary feed through isolation of the interconnect structure, with and without the ferrite bead.

FIG. 8 is an exemplary graph of the feed through isolation of the interconnect structure, with and without the ferrite bead. The graph illustrates the advantage of using a ferrite bead that forms a low-pass filter. Besides being a wire mesh captivation feature, the ferrite bead with its inductance provides improved RF isolation. That is contrasted with a capacitive feedthrough that is commonly used. The graph shows improved isolation characteristics of the low-pass filter structure.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A DC interconnect structure for providing a DC interconnect between a first circuit board and a second circuit board in an RF circuit, the interconnect structure comprising:
    a first dielectric cylindrical structure having a first through opening;
    a second dielectric cylindrical structure having a second through opening;
    a ferrite ring structure sandwiched between the first and second dielectric structures;
    an outer conductive o-ring structure encircling the ferrite ring structure;
    a compressive conductor structure passed through the first and second cylindrical structures, the ferrite ring structure and the o-ring structure and having first and second tip portions protruding from the respective first and second cylindrical structures,
    the interconnect structure providing a DC Interconnect between the circuit boards while suppressing RF signals from passing through the interconnect.

2. The structure of claim 1, wherein the compressive conductor structure is a wire mesh structure.

3. The structure of claim 1, wherein the first and second dielectric structures are fabricated of a high K dielectric material.

4. The structure of claim 1, wherein the first dielectric cylindrical structure has a first conductive outer surface structure, and the second dielectric cylindrical structure has a second conductive outer surface structure.

5. The structure of claim 4, wherein the first conductive outer surface structure is a first plated layer, and the second conductive outer surface structure is a second plated layer.

6. The structure of claim 1, wherein the o-ring structure is an elastic structure, comprising an elastomeric material having a metal filler.

7. The structure of claim 1, wherein the ferrite ring structure has a nominal opening having a diameter larger than an outer diameter of the compressive conductor structure, the ferrite ring structure captivating the compressive conductor structure.

8. An RF circuit, comprising:
    a conductive chassis structure having generally planar opposed first and second surfaces, and an opening formed between the first and second surfaces;
    a first circuit board structure positioned adjacent the first surface of the chassis structure;
    a second circuit board structure positioned adjacent the second surface of the chassis structure;
    a DC interconnect structure positioned in said chassis opening in electrical contact with the first and second circuit board structures, the interconnect structure comprising:
        a first dielectric cylindrical structure having a first through opening and a first conductive outer layer;
        a second dielectric cylindrical structure having a second through opening and a second conductive outer layer;
        a ferrite ring structure sandwiched between the first and second dielectric structures;
        an outer o-ring structure encircling the ferrite ring structure;
        a compressible conductor structure passed through the first and second cylindrical structures, the ferrite ring structure and the o-ring structure and having first and second tip portions protruding from the respective first and second cylindrical structures,
    the interconnect structure providing a DC interconnect between the first and second circuit boards while suppressing RF signals from passing through the interconnect.

9. The circuit of claim 8, wherein said o-ring structure is in contact with a conductive wall surface defining said chassis opening.

10. The circuit of claim 8, wherein said first tip portion is compressed against said first circuit board to make a first physical and electrical contact with the first circuit board, and said second tip portion is compressed against said second circuit board to make a second physical and electrical contact with the second circuit board.

11. The circuit of claim 10, wherein said first and second physical and electrical contacts are free of any solder.

12. The circuit of claim 8 wherein the compressible conductor structure is a wire mesh structure.

13. The structure of claim 8, wherein the first and second dielectric cylindrical structures are fabricated of a high K dielectric material.

14. The structure of claim 8, wherein the first dielectric cylindrical structure has a first conductive outer surface structure, and the second dielectric cylindrical structure has a second conductive outer surface structure.

15. The structure of claim 14, wherein the first conductive outer surface structure is a first plated layer, and the second conductive outer surface structure is a second plated layer.

16. The structure of claim 8, wherein the o-ring structure is an elastic structure, comprising an elastomeric material having a metal filler.

17. The structure of claim 8, wherein the ferrite ring structure has a nominal opening having a diameter larger than an outer diameter of the compressible conductor structure, the ferrite ring structure captivating the compressible conductor structure.

* * * * *